United States Patent
Meng

(10) Patent No.: US 11,705,464 B1
(45) Date of Patent: Jul. 18, 2023

(54) DISPLAY PANEL AND DISPLAY DEVICE

(71) Applicant: Guangzhou China Star Optoelectronics Semiconductor Display Technology Co., LTD., Guangdong (CN)

(72) Inventor: Yanhong Meng, Guangdong (CN)

(73) Assignee: Guangzhou China Star Optoelectronics Semiconductor Display Technology Co., LTD., Guangzhou (CN)

( * ) Notice: Subject to any disclaimer, the term of this patent is extended or adjusted under 35 U.S.C. 154(b) by 0 days.

(21) Appl. No.: 17/994,464

(22) Filed: Nov. 28, 2022

(30) Foreign Application Priority Data

Aug. 26, 2022 (CN) .......................... 202211029025.5

(51) Int. Cl.
*H01L 27/12* (2006.01)

(52) U.S. Cl.
CPC ........ *H01L 27/124* (2013.01); *H01L 27/1225* (2013.01)

(58) Field of Classification Search
CPC ........... G02F 1/13685; G02F 1/136227; H01L 27/124
See application file for complete search history.

(56) References Cited

U.S. PATENT DOCUMENTS

| 6,407,782 B1* | 6/2002 | Kim | G02F 1/136227 |
| | | | 349/59 |
| 2001/0017371 A1* | 8/2001 | Tanaka | H10K 59/12 |
| | | | 257/E27.111 |
| 2017/0052417 A1* | 2/2017 | Noh | G02F 1/1343 |

* cited by examiner

Primary Examiner — James A Dudek

(57) ABSTRACT

A display panel and a display device are provided, wherein an insulating layer covers a substrate and a first metal layer, and wherein the insulating layer includes a protruding portion covering a first signal transmission portion. A second metal layer is disposed on a side of the insulating layer away from the first metal layer and includes a second signal transmission portion, wherein the second signal transmission portion covers at least part of a sidewall of the protruding portion. The protruding portion includes a first sub-layer, a second sub-layer, and a first hole arranged at a sidewall of the protruding portion, wherein the first sub-layer is positioned on a side of the second sub-layer away from the first signal transmission portion, and wherein the second signal transmission portion extends into the first hole and contacts the second sub-layer.

20 Claims, 7 Drawing Sheets

DISPLAY PANEL AND DISPLAY DEVICE

RELATED APPLICATION

This application claims the benefit of priority of China Patent Application No. 202211029025.5 filed on Aug. 26, 2022, the contents of which are incorporated by reference as if fully set forth herein in their entirety.

FIELD OF INVENTION

The present application relates to a field of display technology, and in particular, to a display device and a display panel.

BACKGROUND OF INVENTION

At present, in an array substrate of a display panel, there are usually arranging multi-layer insulating layers and metal layers, wherein the metal layers can be used to form thin film transistors or signal lines to transmit electrical signals to realize the display of the display panel, and wherein the insulating layer can be used to separate different layers or metal layers that transmit different signals.

For example, in the array substrate, a gate insulating layer can be provided between the metal layer and a gate electrode for space insulation. However, the gate insulating layer will form a slope at a position covering the gate electrode, so that the metal layer will also form a slope at an overlap position with the gate electrode, wherein the gate insulating layer which in contact with the metal layer is usually a silicon oxide layer, and wherein an adhesion force between the gate insulating layer and the metal layer is relatively small. As a result, the metal layer and the silicon oxide layer are prone to peel off at the slope, and the etching solution is prone to infiltration, thereby resulting in over-etching and wire breakage of the metal layer when etching the metal layer.

SUMMARY OF INVENTION

Embodiments of the present application provide a display panel and a display device, which can improve an adhesion force between a metal layer and an insulating layer, and reduce a probability of wire breakage of the first signal transmission portion.

One embodiment of the present application also provides a display panel, which includes:

a substrate;

a first metal layer disposed on the substrate, wherein the first metal layer includes at least one first signal transmission portion;

an insulating layer covering the substrate and the first metal layer, wherein the insulating layer includes a protruding portion covering the first signal transmission portion, and wherein the protruding portion includes a top surface far away from the first signal transmission portion and a sidewall connected to a peripheral side of the top surface; and a second metal layer disposed on a side of the insulating layer away from the first metal is layer, wherein the second metal layer includes at least one second signal transmission portion, and wherein the second signal transmission portion covers at least part of the sidewall of protruding portion;

wherein the protruding portion includes a first sub-layer and a second sub-layer which are arranged in layers, wherein the first sub-layer is positioned on a side of the second sub-layer away from the first signal transmission portion, wherein the protruding portion includes at least one first hole provided at the sidewall, wherein the second signal transmission portion extends into the first hole and contacts the second sub-layer, and wherein an adhesion force between the second sub-layer and the second signal transmission portion is greater than an adhesion force between the first sub-layer and the second signal transmission portion the adhesion force between the first sub-layer and the second signal transmission portion.

In one embodiment of the present application, the display panel includes a plurality of thin film transistors disposed on the substrate, wherein the thin film transistor includes a gate electrode, an active portion, a source electrode, and a drain electrode, and wherein the source electrode and the drain electrode are lapped with the active portion;

wherein the first signal transmission portion includes the gate electrode, wherein the second signal transmission portion includes the source electrode and the drain electrode, wherein the protruding portion covers the gate electrode, wherein the active portion is disposed at the top surface of the protruding portion, wherein the source electrode covers the sidewall of the protruding portion and extends to a side of the active portion away from the protruding portion, wherein the source electrode in contact with the second sub-layer through the first hole, wherein the drain electrode covers the sidewall of the protruding portion and extends to the side of the active portion away from the protruding portion, and wherein the drain electrode is in contact with the second sub-layer through the first hole.

In one embodiment of the present application, the display panel further includes a non-display region, wherein the first signal transmission portion includes a first wire arranged in the non-display region, wherein the second signal transmission portion includes a second wire arranged in the non-display region, wherein the protruding portion covers the first wire, wherein the second wire is positioned at a side of the protruding portion away from the first wire, and wherein the second wire in contact with the second sub-layer by passing through the first hole.

In one embodiment of the present application, the active portion is made of an oxide semiconductor material, and wherein the second sub-layer is made of a material that isolating water and oxygen.

In one embodiment of the present application, a material of the first sub-layer includes a silicon oxide material, and wherein a material of the second sub-layer includes a silicon nitride material.

In one embodiment of the present application, the protruding portion further includes at least one second hole arranged on the top surface close to the sidewall, and wherein the second signal transmission portion also extends into the second hole and in contact with the second sub-layer.

In one embodiment of the present application, the insulating layer further includes a spacing portion, wherein the spacing portion is arranged between two adjacent protruding portions, wherein the spacing portion includes a third sub-layer and a fourth sub-layer which are arranged in layers, wherein the third sub-layer is positioned on a side of the fourth sub-layer away from the substrate, wherein the third sub-layer is in a same layer as the first sub-layer, and wherein the fourth sub-layer is in a same layer as the second sub-layer;

wherein at least one third hole is provided on a side of the spacing portion close to the protruding portion, wherein the second signal transmission portion extends into the third hole and in contact with the fourth sub-layer, and wherein an adhesion force between the fourth sub-layer and the second signal transmission portion is greater than an adhesion force between the third sub-layer and the second signal transmission portion.

In one embodiment of the present application, the display panel further includes a first interlayer dielectric layer covering the insulating layer and the second metal layer, wherein the first interlayer dielectric layer and the third sub-layer are arranged in layers, and wherein a material of the first interlayer dielectric layer and a material of the third sub-layer include a silicon oxide material.

In one embodiment of the present application, in a vertical direction corresponding to the spacing portion, a sum of a thicknesses of the third sub-layer and a thickness of the first interlayer dielectric layer is greater than or equal to 3300 angstroms and less than or equal to 4200 angstroms.

In one embodiment of the present application, in the vertical direction corresponding to the spacing portion, the thickness of the third sub-layer is greater than or equal to 500 angstroms and less than or equal to 2000 angstroms, and wherein the thickness of the first interlayer dielectric layer is greater than or equal to 1000 angstroms and less than or equal to 3000 angstroms.

According to the above object of the present application, one embodiment of the present application further provides a display device, which includes the display panel.

Beneficial effects of the present application: In the present application, the insulating layer forms a protruding portion at the position covering the first signal transmission portion, wherein the protruding portion is in a shape of a slope at a sidewall, however, in the present application, by providing a first hole at a sidewall of the insulating layer, the second signal transmission portion can be extended into the first hole and contacts the second sub-layer, and further, since an adhesion force between the second signal transmission portion and the second sub-layer is greater than an adhesion force between the second signal transmission portion and the first sub-layer, an adhesion force between the second signal transmission portion and the insulating layer at the sidewall of the protruding portion can be improved, thereby a probability of wire breakage at the slope is reduced, and a yield rate of the display panel is improved.

DESCRIPTION OF FIGURES

The technical solutions and other beneficial effects of the present application will be apparent through the detailed description of specific embodiments of the present application in conjunction with the accompanying figures.

DETAILED DESCRIPTION OF EMBODIMENTS

Figure 1:
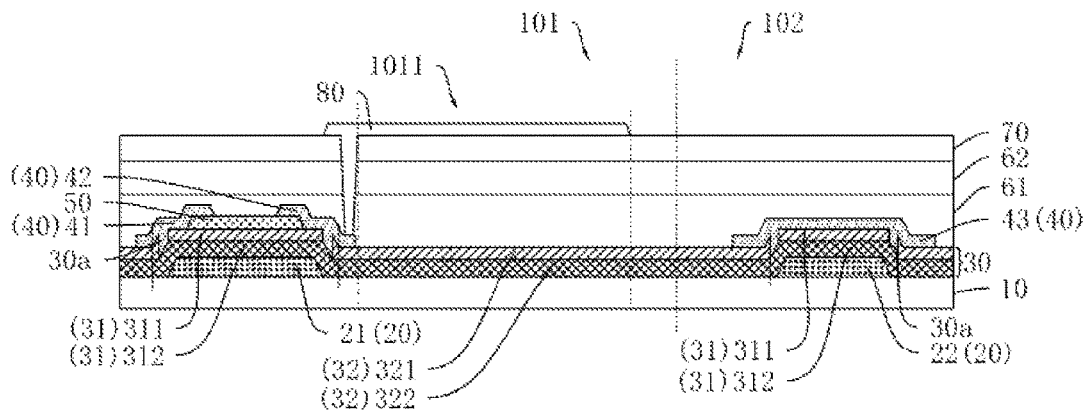
FIG. 1 is a schematic structural diagram of a display panel provided by one embodiment of the present application.

The technical solutions in the embodiments of the present application will be described clearly and completely below in conjunction with the accompanying figures in the embodiments of the present application. Obviously, the described embodiments are only a part of the embodiments of the present application, and not all of them. Based on the embodiments in the present application, all other embodiments obtained by a person skilled in the art without inventive steps fall within a scope of protection of the present application.

The following disclosure provides a number of different embodiments or examples for implementing different structures of the present application. In order to simplify the disclosure of the present application, the components and settings of particular examples are described below. Of course, they are only examples and are not intended to limit the invention. Furthermore, the present application may repeat reference numerals is and/or reference letters in different examples, such repetition being for a purpose of simplification and clarity and not in itself indicative of a relationship between the various embodiments and/or settings discussed. In addition, various examples of specific processes and materials are provided by the present application, but one of ordinary skill in the art may be aware of other process applications and/or other materials used.

Figure 2:
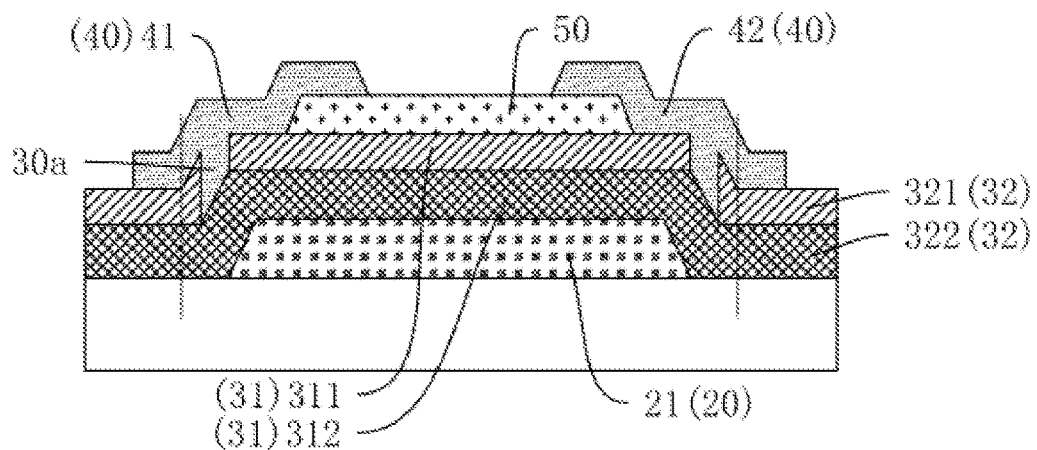
FIG. 2 is a partially enlarged view of a position of a thin film transistor of the display panel provided by one embodiment of the present application.
Figure 3:
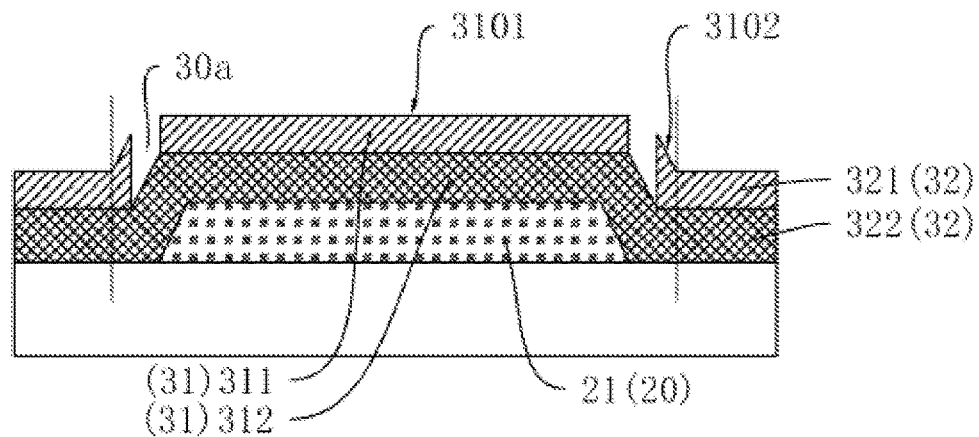
FIG. 3 is a partially enlarged view of a position of a protruding portion of the display panel provided by one embodiment of the present application.

Embodiments of the present application also provide a display panel, referring to FIG. 1, FIG. 2, and FIG. 3, which includes a substrate 10, a first metal layer, an insulating layer 30, and a second metal layer.

The first metal layer is provided on the substrate 10 and includes at least one first signal transmission portion 20. The insulating layer 30 covers the substrate 10 and the first metal layer. The insulating layer 30 includes a protruding portion 31 covering the first signal transmission portion 20. The protruding portion 31 includes a top surface 3101 on a side away from the first signal transmission portion 20 and a sidewall 3102 attached to a peripheral side of the top surface 3101. The second metal layer is disposed on a side of the insulating layer 30 away from the first metal layer and includes at least one second signal transmission portion 40. The second signal transmission portion 40 covers at least a portion of the sidewall 3102 of the protruding portion 31.

The protruding portion 31 includes a first sub-layer 311 and a second sub-layer 312 which are arranged in layers. The first sub-layer 311 is positioned on a side of the second sub-layer 312 away from the first signal transmission portion 20. The protruding portion 31 includes at least one first hole 30a provided at the sidewall 3102. The second signal transmission portion 40 extends into the first hole 30a and contacts the second sub-layer 312. An adhesion force between the second sub-layer 312 and the second signal transmission portion 40 is greater than an adhesion force between the first sub-layer 311 and the second signal transmission portion 40.

In the embodiments of the application, the insulating layer 30 forms a protruding portion 31 at a position covering the first signal transmission portion 20, and the protruding portion 31 has a slope shape at the sidewall 3102. Therefore, in the embodiment of the present application, by further providing a first hole 30a at the sidewall 3102 of the insulating layer 30, the second signal transmission portion 40 can be extended into the first hole 30a and contacts the second sub-layer 312. Moreover, since the adhesion force between the second signal transmission portion 40 and the second sub-layer 312 is greater than the adhesion force between the second signal transmission portion 40 and the first sub-layer 311, an adhesion force between the second signal transmission portion 40 and the insulating layer 30 at the sidewall 3102 of the protruding portion 31 can be improved, thereby reducing a probability of wire breakage of the second signal transmission portion 40 at a slope portion, and improving the yield rate of the display panel.

In detail, in one embodiment of the present application, please continue to refer to FIG. 1, FIG. 2, and FIG. 3. The display panel includes a substrate 10, a first metal layer provided on the substrate 10, an insulating layer 30 provided on and covering the first metal layer, a second metal layer provided on the insulating layer 30, a first interlayer dielectric layer 61 provided covering the insulating layer 30 and the second metal layer, a second interlayer dielectric layer 62 provided on the first interlayer dielectric layer 61, an organic insulating layer 70 provided on the second interlayer dielectric layer 62, and a pixel electrode 80 provided on the organic insulating layer 70.

The first metal layer includes at least one first signal transmission portion 20 provided on the substrate 10, and it can be understood that the first signal transmission portion 20 may be an electrode component, signal wire alignment, etc. provided on the substrate 10.

The insulating layer 30 covers the first metal layer, and the insulating layer 30 covers the at least one first signal transmission portion 20. In detail, the first signal transmission portion 20 is provided on a surface of the substrate 10 and is protruding relative to the surface of the substrate 10, wherein the insulating layer 30 covers the first signal transmission portion 20, wherein the insulating layer 30 forms a protruding portion 31 at the position of the first signal transmission portion 20, and wherein the protruding portion 31 includes a top surface 31 at a side of away from the substrate 10 and a sidewall 3102 connected to a peripheral side of the top surface 3101. It can be understood that the top surface 3101 of the protruding portion 31 is the upper surface of the protruding portion 31 away from the substrate 10, and the sidewall 3102 is a side surface of the protruding portion 31 connected to the upper surface. In the embodiment of the present application, the protruding portion 31 forms a slope shape at the sidewall 3102.

The second metal layer includes a second signal transmission portion 40 provided on the insulating layer 30, wherein the second signal transmission portion 40 has an overlapping portion with the first signal transmission portion 20. The second signal transmission portion 40 is positioned at least at the sidewall 3102 of the protruding portion 31, i.e., the second signal transmission portion 40 covers a portion in a slope shape of the sidewall 3102 of the protruding portion 31.

Further, the protruding portion 31 includes a first sub-layer 311 and a second sub-layer 312 which are arranged in layers, wherein the first sub-layer 311 is positioned on a side of the second sub-layer 312 away from the first signal transmission portion 20.

In one embodiment of the present application, at least one first hole 30a is provided at the sidewall 3102 of the protruding portion 31, and the second signal transmission portion 40 extends into the first hole 30a and contacts the second sub-layer 312, i.e., the first hole 30a at least passes through the first sub-layer 311 to expose the second sub-layer 312, so that the second signal transmission portion 40 can contact the second sub-layer 312.

It can be understood that a depth of the first hole 30a may be equal to a thickness of the first sub-layer 311, at which point the first hole 30a passes through the first sub-layer 311 and ends at the second sub-layer 312. The depth of the first hole 30a may also be greater than the thickness of the first sub-layer 311, at which point the first hole 30a passes through the first sub-layer 311 and a portion of the second sub-layer 312, so that the second signal transmission portion 40 can be in contact with the second sub-layer 312.

The adhesion force between the second sub-layer 312 and the second signal transmission portion 40 is greater than the adhesion force between the first sub-layer 311 and the second signal transmission portion 40. Since the second signal transmission portion 40 is prone to occur film layer peeling off at the sidewall 3102 of the protruding portion 31, the embodiment of the present application provides a first hole 30a at the sidewall 3102 of the protruding portion 31 to enable the second signal transmission portion 40 extends into the first hole 30a and contact the second sub-layer 312 to improve the adhesion force between the second signal transmission portion 40 and the protruding portion 31, thereby reducing a probability of peeling off of the second signal transmission portion 40 at the sidewall 3102 of the protruding portion 31, reducing a probability of wire breakage of the second signal transmission portion 40 at the slope portion, and improving the yield rate of the display panel.

In one embodiment of the present application, the active portion 50 may be made of an oxide semiconductor material and the second sub-layer 312 may be made of a material that is insulated from water and oxygen. Further, a material of the first sub-layer 311 is a silicon oxide material and a material of the second sub-layer 312 is a silicon nitride material. The materials of the first metal layer and the second metal layer can be commonly used conductive metal materials, such as copper, aluminum, molybdenum, titanium, etc.

In detail, the insulating layer 30 adopts a stacked structure of silicon oxide and silicon nitride, wherein the silicon nitride in contact with the first metal layer to act as a barrier to water, oxygen, and metal ion diffusion (e.g., copper diffusion), and wherein the silicon oxide in contact with the oxide semiconductor active portion 50 to ensure the normal characteristics of the thin film transistor.

Figure 4:
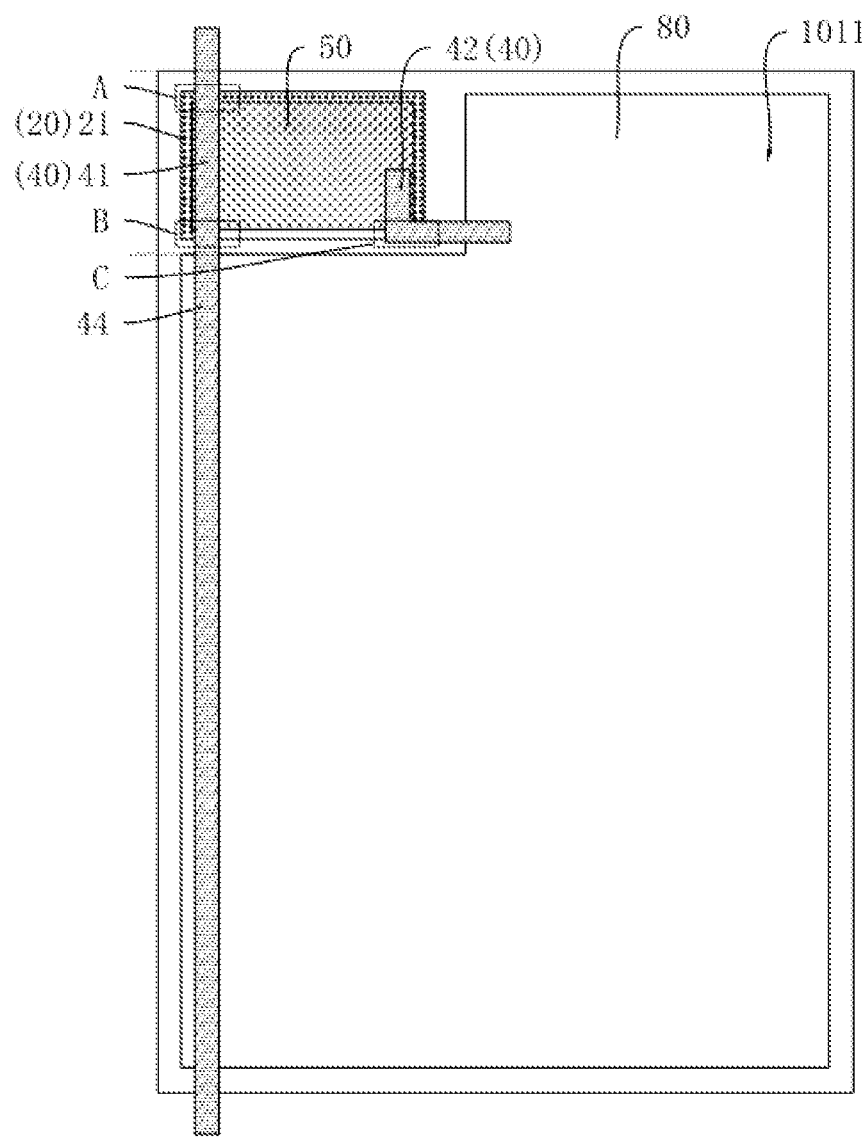
FIG. 4 is a schematic diagram of a plane distribution structure of the display panel provided by one embodiment of the present application.

In one embodiment of the present application, the display panel further includes a plurality of thin film transistors provided on the substrate 10, and each thin film transistor includes a gate electrode 21, an active portion 50, a source electrode 41, and a drain electrode 42. The source electrode 41 and the drain electrode are lapped to both sides of the active portion 50. The first signal transmission portion 20 may include the gate electrode 21 of the thin film transistor. The second signal transmission portion 40 may include the source electrode 41 and the drain electrode 42 of the thin film transistor. Please in conjunction with FIG. 1 and FIG. 4, the second metal layer further includes a data line 44 connected to the source electrode 41, wherein the source electrode 41 and drain electrode 42 are lapped to the active portion 50, which further create overlaps between the source electrode 41 and the gate electrode 21 and between the drain electrode 42 and the gate electrode 21. Moreover, the source electrode 41 forms a slope shape at position A and position B, and similarly, the drain electrode 42 forms a slope shape at position C.

In detail, the insulating layer 30 covers the gate electrode 21 and forms a protruding portion 31 at the gate electrode 21, wherein the protruding portion 31 includes a top surface 3101 away from the gate electrode 21 and a sidewall 3102 connected to a peripheral side of the top surface 3101, and wherein the active portion 50 is provided at the top surface 3101 of the protruding portion 31. The source electrode 41 and the drain electrode 42 are provided on the insulating layer 30, and the source electrode 41 covers the sidewall 3102 of the protruding portion 31, wherein the source electrode 41 extends to the surface of the active portion 50 on a side away from the substrate 10 to lap with the is active portion 50. Similarly, the drain electrode 42 covers the sidewall 3102 of the protruding portion 31 and extends to the surface of the active portion 50 on the side away from the substrate 10 to lap with the active portion 50. In addition, the protruding portion 31 is provided with at least one first hole 30a at the sidewall 3102. Both the source electrode 41 and the drain electrode 42 extend into the first hole 30a and lap with the second sub-layer 312, wherein an adhesion force between the source electrode 41 and the second sub-layer 312 is greater than an adhesion force between the source electrode 41 and the first sub-layer 311, and wherein an adhesion force between the drain electrode 42 and the second sub-layer 312 is greater than an adhesion force between the drain electrode 42 and the first sub-layer 311. Therefore, at the overlapping slope of the source electrode 41, the drain electrode 42, and the gate electrode 21, the embodiment of the present application can improve the adhesion force between the source electrode 41, the drain electrode 42, and the insulating layer 30, thereby reducing a probability of peeling off between the drain electrode 42 and the insulating layer 30, reducing a probability of wire breakage of the source electrode 41 and the drain electrode 42 at the slope portion, and improving the yield rate of the display panel.

Further, in one embodiment of the present application, the display panel further includes a non-display region 102. The first signal transmission portion 20 may further include a first wire 22 provided on the substrate 10 and positioned within the non-display region 102, wherein the second signal transmission portion 40 may further include a second wire 43 provided on the insulating layer 30 and positioned within the non-display region 102.

In detail, the first wire 22 and the second wire 43 have an overlap portion in the non-display region 102, and wherein in the overlap portion of the first wire 22 and the second wire 43, the insulating layer 30 covers the first wire 22 and forms a protruding portion 31 at a position of the first wire 22. The protruding portion 31 includes a top surface 3101 away from a side of the first wire 22, and a sidewall 3102 connected to a peripheral side of the top surface 3101. The second wire 43 is positioned on a side of the protruding portion 31 away from the first wire 22, wherein the second wire 43 extends from the sidewall 3102 of the protruding portion 31 to the top surface 3101 of the protruding portion 31. In addition, the protruding portion 31 is provided with at least one first hole 30a at the sidewall 3102, wherein the second wire 43 extends into the first hole 30a and laps with the second sub-layer 312, and wherein an adhesion force between the second wire 43 and the is second sub-layer 312 is greater than an adhesion force between the second wire 43 and the first sub-layer 311. Therefore, at the overlapping slope of the second wire 43 and the first wire 22, the embodiment of the present application can improve the adhesion force between the second wire 43 and the insulating layer 30, thereby reducing a probability of peeling off between the second wire 43 and the insulating layer 30, reducing a probability of wire breakage at a slope of the second wire 43, and improving a yield rate of the display panel.

It can be noted that in this embodiment of the present application, by providing a first hole 30a at the sidewall 3102 of the protruding portion 31, the second signal transmission portion 40 can be extended into the first hole 30a and contacts the second sub-layer 312 to improve the adhesion force between the second signal transmission portion 40 and the insulating layer 30, thereby reducing a probability of peeling off the second signal transmission portion 40, reducing a probability of line breakage of the second signal transmission portion 40, and improving a yield rate of the display panel. A number of the first hole 30a may be one or greater than one, without limitation herein. A coverage of the first hole 30a may include an entire area of the second signal transmission portion 40 covering the sidewall 3102 of the protruding portion 31 when the number of the first hole 30a is one, to maximize the adhesion force between the second signal transmission portion 40 and the insulating layer 30.

Further, the insulating layer 30 further includes a spacing portion 32 connected to the protruding portion 31. It can be understood that a portion of the insulating layer 30 covering the first signal transmission portion 20 is the protruding portion 31, and the other portion of the insulating layer 30 covering the substrate 10 may be the spacing portion 32, i.e., the spacing portion 32 may be provided between any two adjacent protruding portions 31 when the number of protruding portions 31 is a plurality.

The spacing portion 32 includes a third sub-layer 321 and a fourth sub-layer 322 which are arranged in layers on the substrate 10, wherein the third sub-layer 321 is positioned on a side of the fourth sub-layer 322 away from the substrate 10.

The third sub-layer 321 may be connected to and provided in a same layer as the first sub-layer 311. The fourth sub-layer 322 may be connected to and provided in a same layer as the second sub-layer 312. A material of the third sub-layer 321 may be the same as a material of the first sub-layer 311, such as a silicon oxide material. A material of the fourth sub-layer 322 may be the same as a material of the second sub-layer 312, such as a silicon nitride material. That is, the third sub-layer 321 can be integrally molded set with the first sub-layer 311, and the fourth sub-layer 322 can be integrally molded set with the second sub-layer 312.

Further, the first interlayer dielectric layer 61 covers the first metal layer, the active portion 50 and the insulating layer 30. A material of the first interlayer dielectric layer 61 includes silicon oxide material. A material of the second interlayer media layer 62 includes silicon nitride material. The first interlayer dielectric layer 61 is positioned between the second interlayer media layer 62 and the substrate 10, wherein the first interlayer dielectric layer 61 and the spacing portion part 32 are stacked. In detail, the first interlayer dielectric layer 61 and the third sub-layer 321 are arranged in layers.

It should be noted that the display panel provided by the embodiment of the present application can be applied to a liquid crystal display. The display panel also includes an opposing substrate disposed on a side of the pixel electrode 80 away from the substrate 10, wherein a liquid crystal layer is sandwiched between the opposing substrate and the substrate 10. A common electrode can be provided on a side of the opposing substrate near the substrate 10. An electric field can be formed between the common electrode and the pixel electrode 80 to control a deflection of the liquid crystal molecules in the liquid crystal layer. Therefore, at least part of the light can pass through the substrate 10, the liquid crystal layer, and the opposite substrate when the backlight in the liquid crystal display emits light, wherein a polarization direction of the transmitted light can be adjusted by the liquid crystal layer. It should be noted that the pixel electrode 80 is made of transparent conductive material, which can further allow light to pass through to form a light-transmitting region of the display panel.

The display panel includes a display region 101. A plurality of sub-pixel units 1011 are provided within the display region 101. In detail, each sub-pixel unit 1011 is a portion of the display panel corresponding to a pixel electrode 80, i.e., corresponding to the light-transmitting region of the display panel. In each sub-pixel unit 1011. There are a plurality of film layer intersections, such as an intersection of the substrate 10 with the fourth sub-layer 322, an intersection of the fourth sub-layer 322 with the third sub-layer 321, an intersection of the third sub-layer 321 with the first interlayer dielectric layer 61, an intersection of the first interlayer dielectric layer 61 with the second inter-layer dielectric layer 62, and an intersection of the second inter-layer dielectric layer 62 with the organic is insulating layer 70. Because of differences in refractive indices of the various materials, there is more reflection and interference of light at the above-mentioned interfaces, which greatly reduces the transmission rate of the display panel.

Figure 5:
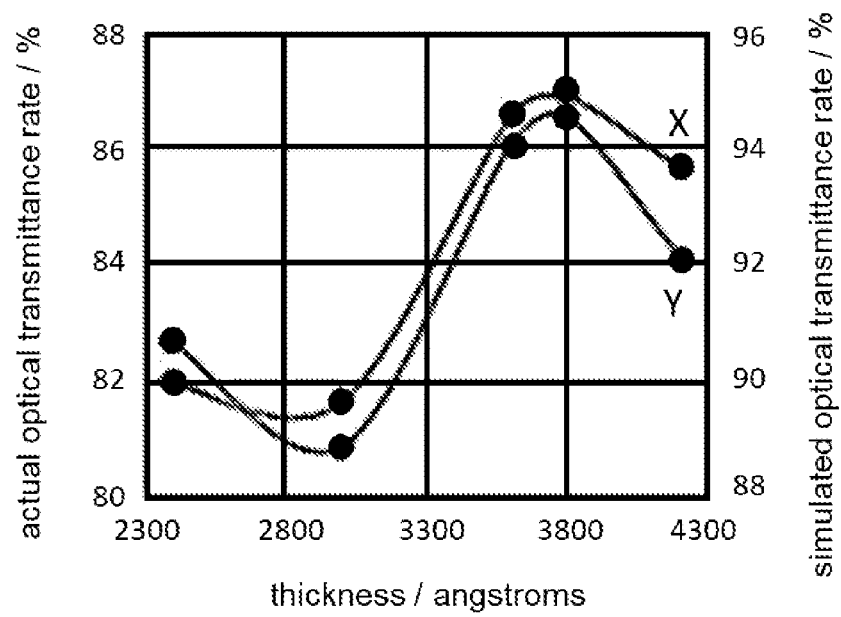
FIG. 5 is a graph of a penetration rate verification results provided by one embodiment of the present application.

Therefore, the embodiment of the present application designs the thicknesses of the stacked first interlayer dielectric layer 61 and the third sub-layer 321, and verifies an actual optical transmittance of the display panel at different thickness and a transmittance obtained by optical simulation to obtain a graph of the verification results as shown in FIG. 5.

Curve X is an actual optical transmittance rate curve of the display panel. Curve Y is a simulated optical transmittance rate curve of the display panel. As can be seen from FIG. 5, an actual optical transmittance rate and a simulated optical transmittance rate of the display panel are both reach 84% or more when a sum of the thicknesses of the first interlayer dielectric layer 61 and the third sub-layer 321 is greater than or equal to 3300 angstroms and less than or equal to 4200 angstroms in a vertical direction corresponding to the spacing portion 32. Preferably, the actual optical transmittance and the simulated optical transmittance of the display panel both reach the maximum when the sum of the thicknesses of the first interlayer dielectric layer 61 and the third sub-layer 321 is 3600 angstroms, i.e., the actual optical transmittance reaches about 87%, and the simulated optical transmittance is also close to 87%, which will effectively reduce an interference phenomenon of the display panel in each subpixel unit 1011 due to a difference of the refractive index of each film layer, thereby improving a transmittance of the display panel, improving a brightness of the display panel, and effectively reducing a power consumption of the display panel.

Further, since the materials of the third sub-layer 321 and the first interlayer dielectric layer 61 are both silicon oxide material, when the thickness of the third sub-layer 321 and the first interlayer dielectric layer 61 needs to reach a preset thickness to improve the transmittance of the display panel, at least the third sub-layer 321 is provided in the insulating layer 30 in each sub-pixel unit 1011 in one embodiment of the present application, which can prevent the first interlayer dielectric layer 61 from being made too thick and causing wasted capacity. At the same time, if the thickness of the first interlayer dielectric layer 61 is too large because the first interlayer dielectric layer 61 also covers the active portion 50, which will cause the oxygen element above a channel of the active portion 50 be increased, which will easily lead to increase adsorption of oxygen by the active portion 50 and make a threshold voltage of the thin film transistor positively biased. Therefore, in the embodiment of the present application, the thickness of the first interlayer dielectric layer 61 is ensured to be not too large to improve a stability of the thin film transistor and a yield rate of the display panel.

Optionally, in the sub-pixel unit 1011, the thickness of the third sub-layer 321 is greater than or equal to 500 angstroms and less than or equal to 2000 angstroms, and the thickness of the first interlayer dielectric layer 61 is greater than or equal to 1000 angstroms and less than or equal to 3000 angstroms in the vertical direction corresponding to the spacing portion 32.

Inherent the above, since the insulating layer 30 forms a protruding portion 31 at the position covering the first signal transmission portion 20, and wherein the protruding portion 31 has a slope shape at the sidewall 3102, in this embodiment of the present application, the second signal transmission portion 40 can be extended into a first hole 30a and contact the second sub-layer 312 by providing the first hole 30a at the sidewall 3102 of the insulating layer 30. Further, since the adhesion force between the second signal transmission portion 40 and the second sub-layer 312 is greater than the adhesion force between the second signal transmission portion 40 and the first sub-layer 311, the adhesion force between the second signal transmission portion 40 and the insulating layer 30 at the sidewall 3102 of the protruding portion 31 can be improved, a probability of wire breakage of the second signal transmission portion 40 at the slope portion can be reduced, and a yield rate of the display panel can be improved.

Figure 6:
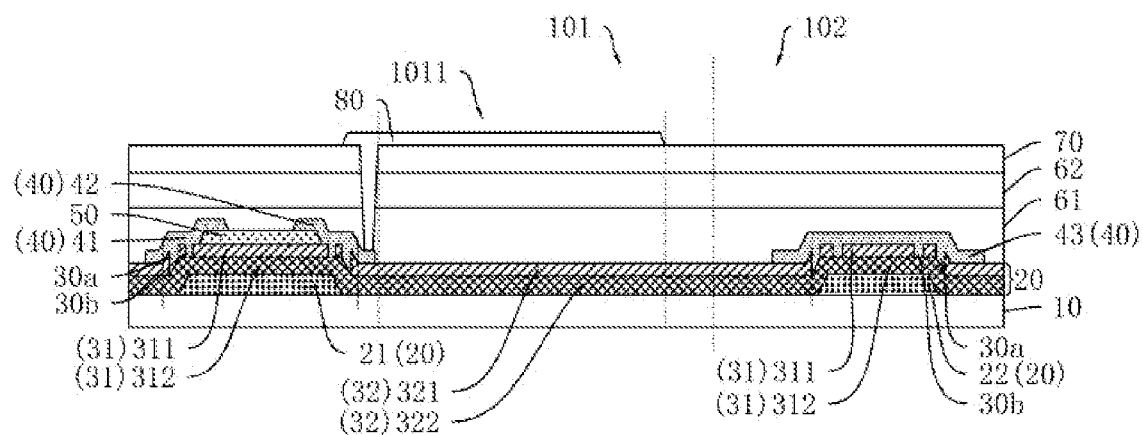
FIG. 6 is another schematic structural diagram of the display panel provided by one embodiment of the present application.

In another embodiment of the present application, please refer to FIG. 6. A difference between this embodiment and the previous embodiment is that at least one second hole 30b is provided on the top surface 3101 of the protruding portion 31 near the sidewall 3102, and the second signal transmission portion 40 also extends into the second hole 30b to contact the second sub-layer 312, to further improve the adhesion force between the second signal transmission portion 40 and the insulating layer 30, reduce the probability of peeling off between the second signal transmission portion 40 and the insulating layer 30 at the slope portion, and reduce the probability of wire breakage of the second signal transmission portion 40 at the slope portion.

In detail, the source electrode 41 further extends into the second hole 30b to contact the second sub-layer 312, the drain electrode 42 further extends into the second hole 30b to contact the second sub-layer 312, and the second wire 43 further extends into is the second hole 30b to contact the second sub-layer 312.

It should be noted that the number and a coverage area of the second holes 30b are not limited in this embodiment of the present application, and can be selected according to actual needs.

Inherent the above, since the insulating layer 30 forms a protruding portion 31 at the position covering the first signal transmission portion 20, and the protruding portion 31 is in a slope shape at the sidewall 3102, in the embodiment of the present application, the first hole 30a is provided at the sidewall 3102 of the insulating layer 30, and the second hole 30b is provided at the top surface 3101 close to the sidewall 3102. Therefore, the second signal transmission portion 40 can be extended inside the first hole 30a and inside the second hole 30b to in contact with the second sub-layer 312. Further, since an adhesion force between the second signal transmission portion 40 and the second sub-layer 312 is greater than an adhesion force between the second signal transmission portion 40 and the first sub-layer 311, thereby improving an adhesion force between the second signal transmission portion 40 and the insulating layer 30 at the sidewall 3102 of the protruding portion 31, reducing a probability of wire breakage of the second signal transmission portion 40 at a slope portion, and improving the yield rate of the display panel.

Figure 7:
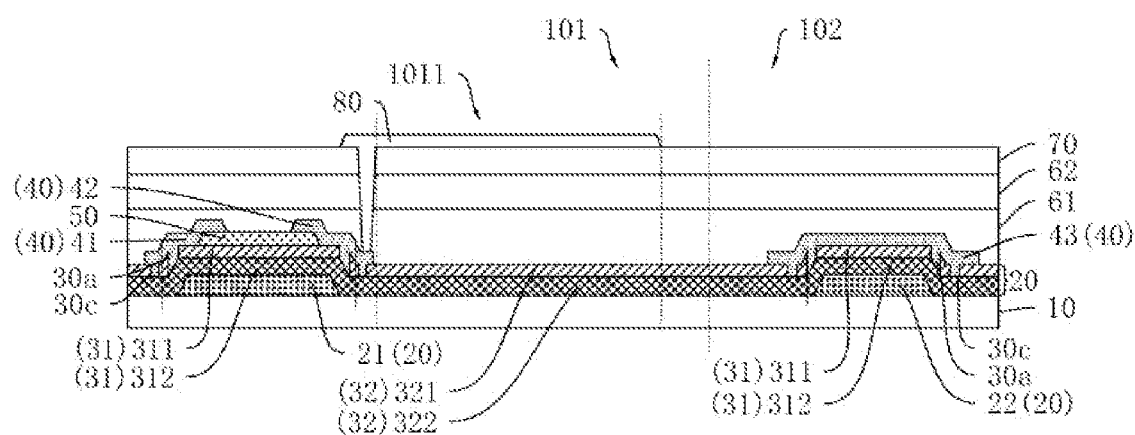
FIG. 7 is another schematic structural diagram of the display panel provided by one embodiment of the present application.

In another embodiment of the present application, please refer to FIG. 7, a difference between this embodiment and the first embodiment is that the spacing portion 32 is provided with at least one third hole 30c near the protruding portion 31, and the second signal transmission portion 40 also extends into the third hole 30c to contact the fourth sub-layer 322. Therefore, an adhesion force between the second signal transmission portion 40 and the fourth sub-layer 322 is greater than an adhesion force between the second signal transmission portion 40 and the third sub-layer 321, to further improve the adhesion force between the second signal transmission portion 40 and the insulating layer 30, reduce a probability of peeling off between the second signal transmission portion 40 and the insulating layer 30 at the slope portion, and reduce a probability of wire breakage of the second signal transmission portion 40 at the slope portion, thereby improving a yield rate of the display panel.

In detail, the source electrode 41 also extends into the third hole 30c to contact the fourth sub-layer 322, the drain electrode 42 also extends into the third hole 30c to is contact the fourth sub-layer 322, and the second wire 43 also extends into the third hole 30c to contact the fourth sub-layer 322.

It should be noted that the number and coverage area of the third hole 30c are not limited in this embodiment of the present application, and can be selected according to actual needs.

Inherent the above, since the insulating layer 30 forms the protruding portion 31 at the position covering the first signal transmission portion 20, and the protruding portion 31 is in the slope shape of at the sidewall 3102, in the embodiment of the present application, the first hole 30a is provided at the sidewall 3102 of the insulating layer 30, and the third hole 30c is provided at the spacing portion 32 near the protruding portion 31, so that the second signal transmission portion 40 can be extended into the first hole 30a to contact the second sub-layer 312, and further can be extended into the third hole 30c to contact the fourth sub-layer 322. Further, since the adhesion force between the second signal transmission portion 40 and the second sub-layer 312 is greater than the adhesion force between the second signal transmission portion 40 and the first sub-layer 311, the adhesion force between the second signal transmission portion 40 and the insulating layer 30 at the sidewall 3102 of the protruding portion 31 can be improved, the probability of wire breakage of the second signal transmission portion 40 at the position of the slope can be reduced, and the yield rate of the display panel can be increased.

Figure 8:
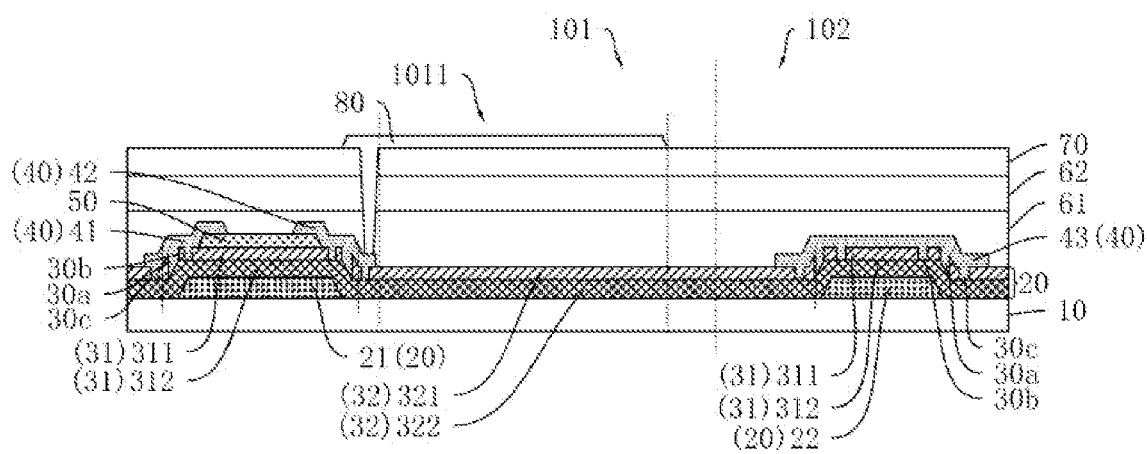
FIG. 8 is another schematic structural diagram of the display panel provided by one embodiment of the present application.
Figure 9:
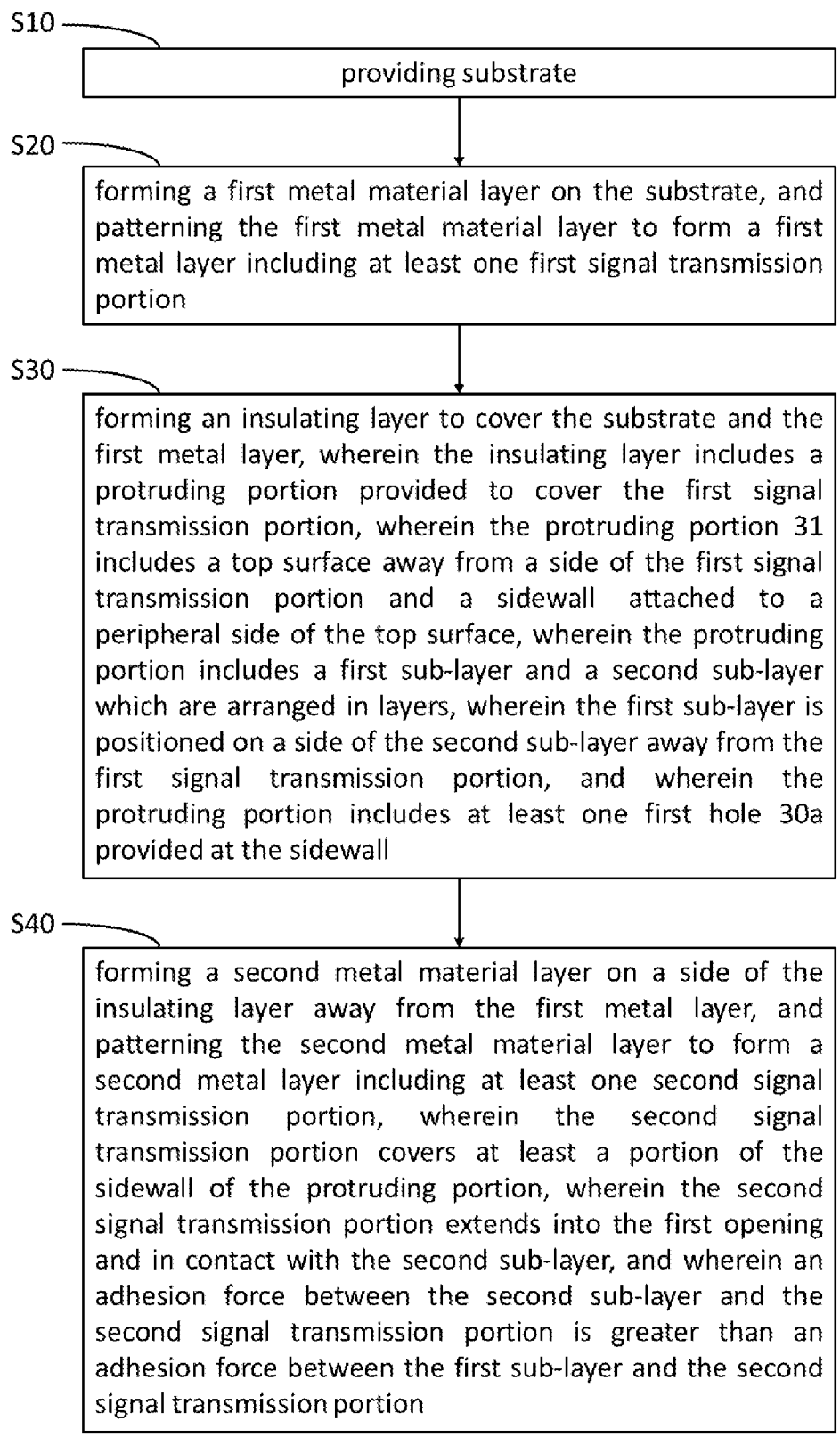
FIG. 9 is a flowchart of a method of manufacturing the display panel provided by one embodiment of the present application.

In another embodiment of the present application, please refer to FIG. 8, a difference between this embodiment and the first embodiment is that: the top surface 3101 of the protruding portion 31 is provided with at least one second hole 30b near the sidewall 3102, and the second signal transmission portion 40 also extends into the second hole 30b and contacts the second sub-layer 312. The spacing portion 32 is provided with at least one third hole 30c near the protruding portion 31, and the second signal transmission portion 40 also extends into the third hole 30c to contact the fourth sub-layer 322. An adhesion force between the second signal transmission portion 40 and the fourth sub-layer 322 is greater than an adhesion force between the second signal transmission portion 40 and the third sub-layer 321 to further improve the adhesion force between the second signal transmission portion 40 and the insulating layer 30, thereby reducing the probability of peeling off between the second signal transmission portion 40 and the insulating layer 30 at the slope portion, and reducing the probability of wire breakage of the second signal transmission portion 40 at the slope portion.

In detail, the source electrode 41 further extends into the second hole 30b to contact the second sub-layer 312, the drain electrode 42 further extends into the second hole 30b to contact the second sub-layer 312, and the second wire 43 further extends into the second hole 30b to contact the second sub-layer 312. The source electrode 41 further extends into the third hole 30c to contact the fourth sub-layer 322, and the drain electrode 42 further extends into the third hole 30c to contact the fourth sub-layer 322, and the second wire 43 also extends into the third hole 30c to contact the fourth sub-layer 322.

It should be noted that the number and coverage area of the second hole 30b and the third hole 30c are not limited in this embodiment of the present application and can be selected according to actual needs.

Inherent the above, since the insulating layer 30 forms the protruding portion 31 at the position covering the first signal transmission portion 20, and the protruding portion 31 has a slope shape at the sidewall 3102, the present application embodiment provides a first hole 30a at the sidewall 3102 of the insulating layer 30, a second hole 30b at the top surface 3101 of the protruding portion 31 near the sidewall 3102, and a third hole 30c at the spacing portion 32 near the protruding portion 31. Therefore, the second signal transmission portion 40 can be extended into the first hole 30a and the second hole 30b to contact the second sub-layer 312, and can be extended into the third hole 30c to contact the fourth sub-layer 322. Further, due to the adhesion force between the second signal transmission portion 40 and the second sub-layer 312 is greater than the adhesion force between the second signal transmission portion 40 and the first sub-layer 311, the adhesion force between the second signal transmission portion 40 and the insulating layer 30 at the sidewall 3102 of the protruding portion 31 can thus be improved, thereby reducing the probability of wire breakage of the second signal transmission portion 40 at the slope portion, and improving the yield rate of the display panel.

In addition, the embodiment of the present application also provides a method of manufacturing a display panel, please combine with FIG. 1, FIG. 9, and FIG. 10 to FIG. 14, and the display panel is manufactured the method of manufacturing the display panel described in the above embodiment.

The method of manufacturing the display panel includes the following steps.

S10, providing a substrate 10.

S20, forming a first metal material layer on the substrate 10, and patterning the first metal material layer to form a first metal layer including at least one first signal transmission portion 20.

In detail, the at least one first signal transmission portion 20 may include a gate electrode 21 of a thin film transistor and a first wire 22 disposed within the non-display region 102.

S30, forming an insulating layer 30 to cover the substrate 10 and the first metal layer, wherein the insulating layer 30 includes a protruding portion 31 provided to cover the first signal transmission portion 20, wherein the protruding portion 31 includes a top surface 3101 away from a side of the first signal transmission portion 20 and a sidewall 3102 attached to a peripheral side of the top surface 3101, wherein the protruding portion 31 includes a first sub-layer 311 and a second sub-layer 312 which are arranged in layers, wherein the first sub-layer 311 is positioned on a side of the second sub-layer 312 away from the first signal transmission portion 20, and wherein the protruding portion 31 includes at least one first hole 30a provided at the sidewall 3102.

The insulating layer 30 is disposed on a side of the first metal layer away from the substrate 10, and the insulating layer 30 covers the first metal layer, that is, the insulating layer 30 covers the first signal transmission portion 20. Since the first signal transmission portion 20 is protruding from a surface of the substrate 10, the insulating layer 30 forms at least one protruding portion 31 covering at least one first signal transmission portion 20, and one protruding portion 31 corresponds to cover one first signal transmission portion 20. In detail, the insulating layer 30 forms the protruding portion 31 at the corresponding gate electrode 21 to cover the gate electrode 21 and form the protruding portion 31 at a position of the corresponding first wire 22 to cover the first wire 22.

It is noted that the insulating layer 30 also includes a spacing portion 32 connected to the protruding portion 31, and it can be understood that a portion of the insulating layer 30 covering the first signal transmission portion 20 is the protruding portion 31, while the other portion of the insulating layer 30 covering the substrate 10 may be the spacing portion 32.

The protruding portion 31 includes a first sub-layer 311 and a second sub-layer 312 which are arranged in layers, wherein the first sub-layer 311 is positioned on a side of the second sub-layer 312 away from the substrate 10, wherein the spacing portion 32 is includes a third sub-layer 321 and a fourth sub-layer 322 which are arranged in layers, and wherein the third sub-layer 321 is positioned on a side of the fourth sub-layer 322 away from the substrate 10. In detail, the third sub-layer 321 is connected to a first sub-layer 311 and may be integrally formed and set with the first sub-layer 311. The fourth sub-layer 322 is connected to the second sub-layer 312 and may be integrally formed and set with the second sub-layer 312. A material of the third sub-layer 321 may be the same as a material of the first sub-layer 311, such as a silicon oxide material, and a material of the fourth sub-layer 322 may be the same as a material of the second sub-layer 312, such as a silicon nitride material.

Figure 10:
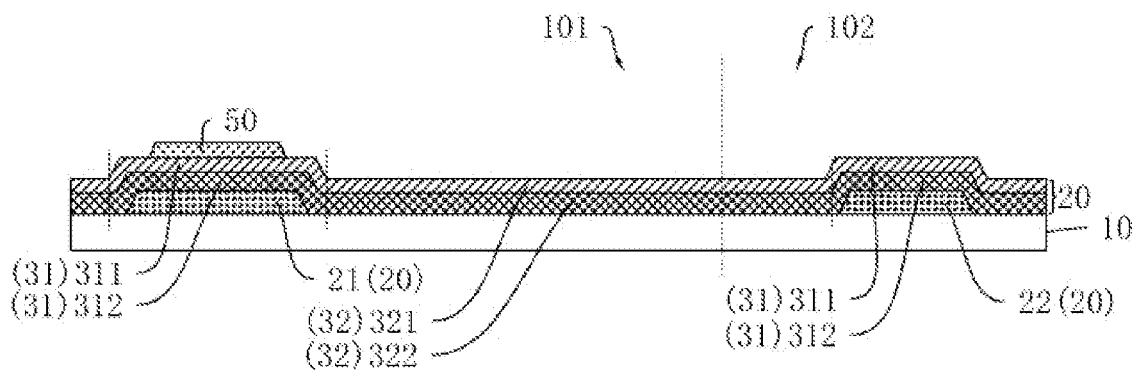
FIGS. 10, 11, 12, 13 and 14 are schematic structural diagrams of a manufacturing process of the display panel provided by one embodiment of the present application.

An active portion 50 is then formed on the insulating layer 30, and the active portion 50 is positioned above the gate electrode 21, as shown in FIG. 10.

Figure 11:
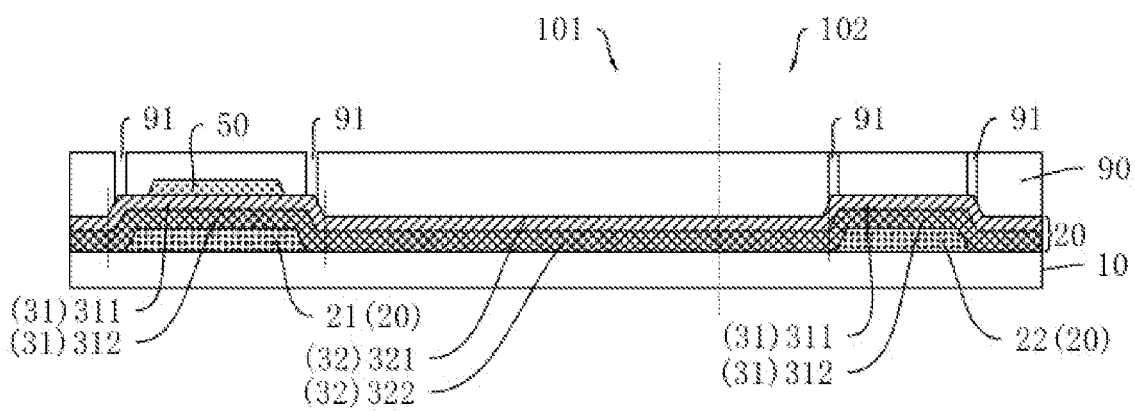

A photoresist layer 90 is formed on the insulating layer 30, wherein a plurality of first openings 91 are formed on the photoresist layer 90. In detail, the plurality of first openings 91 are positioned correspondingly above the sidewalls 3102 of the two protruding portions 31 covering the gate electrode 21 and the first wire 22. A depth of the first openings 91 is equal to a thickness of the photoresist layer 90 to expose the sidewalls 3102 at the two protruding portions 31 covering the gate electrode 21 and the first wire 22, as shown in FIG. 11.

Figure 12:
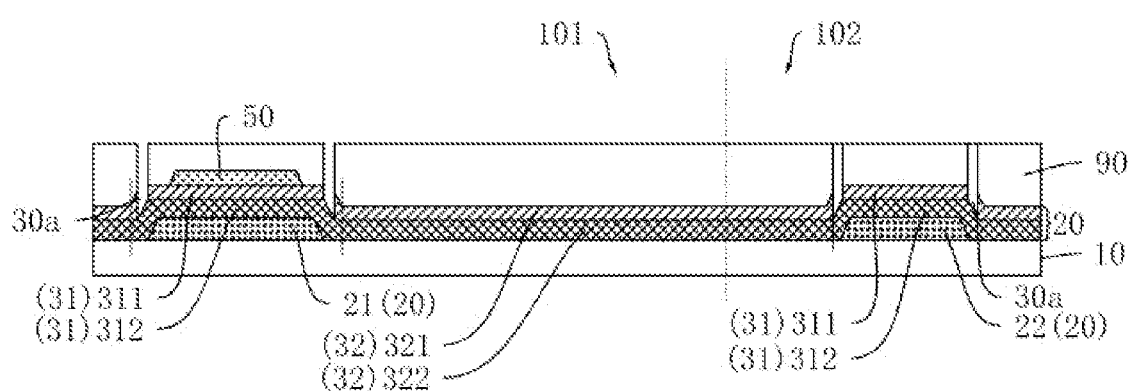

The protruding portions 31 are then etched to form the first hole 30a at the sidewalls 3102 of the protruding portion 31. The first hole 30a needs to pass through at least the first sub-layer 311 to expose the second sub-layer 312. In other embodiments of the present application, the first hole 30a may also pass through the first sub-layer 311 and a portion of the second sub-layer 312, to make a bottom of the first hole 30a exposing the second sub-layer 312, as shown in FIG. 12.

Figure 13:
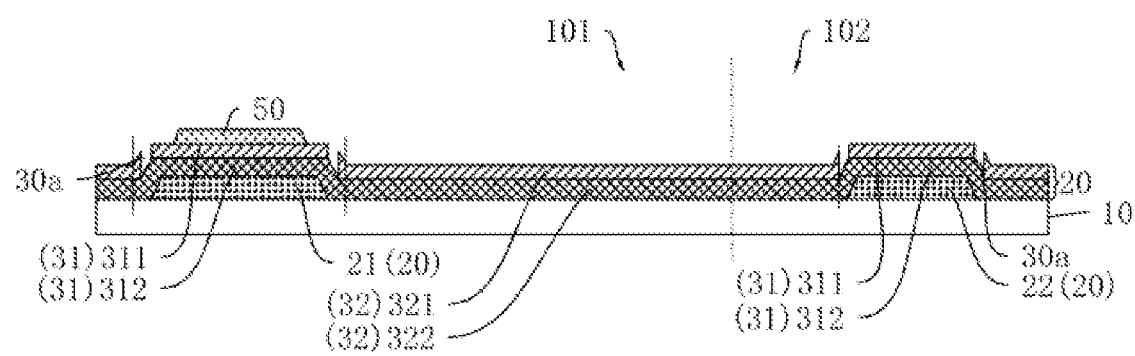

Next, the photoresist layer 90 is removed, as shown in FIG. 13.

S40, forming a second metal material layer on a side of the insulating layer 30 away from the first metal layer, and patterning the second metal material layer to form a second metal layer including at least one second signal transmission portion 40, wherein the second signal transmission portion 40 covers at least a portion of the sidewall 3102 of the protruding portion 31, wherein the second signal transmission portion 40 extends into the first hole 30a and in contact with the second sub-layer 312, and wherein an adhesion force between the second sub-layer 312 and the second signal transmission portion 40 is is greater than an adhesion force between the first sub-layer 311 and the second signal transmission portion 40.

Figure 14:
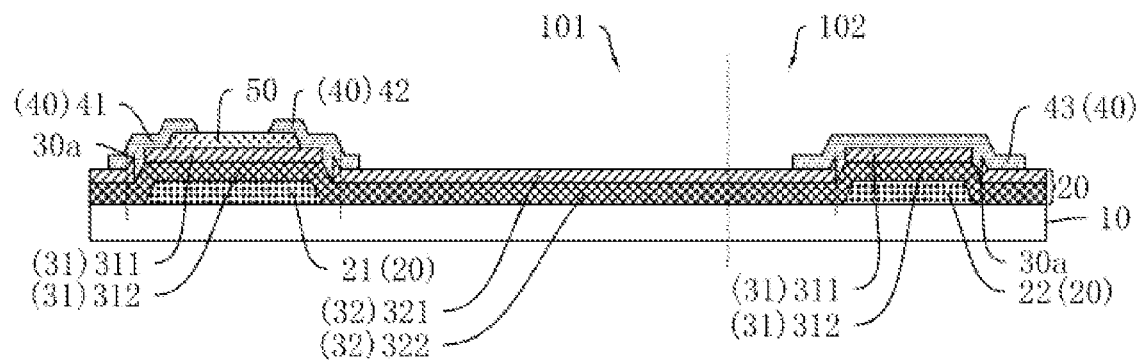

In this embodiment, the at least one second signal transmission portion 40 includes a source electrode 41 and a drain electrode 42 of the thin film transistor, and a second wire 43 positioned in the non-display region 102. The source electrode 41 is positioned in the first hole 30a, in contact with the second sub-layer 312, and extends to a side of the active portion 50 away from the substrate 10. The drain electrode 42 is positioned in the first hole 30a, in contact with the second sub-layer 312, and extends to the side of the active portion 50 away from the substrate 10. The second wire 43 is positioned in the first hole 30a, in contact with the second sub-layer 312, and extends to the top surface 3101 of the protruding portion 31, as shown in FIG. 14.

Then, the first interlayer dielectric layer 61, the second interlayer dielectric layer 62, the organic insulating layer 70, and the pixel electrode 80 are sequentially formed on the second metal layer, as shown in FIG. 1. All of the above structures can be disposed with reference to the above embodiments and will not be repeated here.

In addition, the embodiment of the present application also provides a display device, which includes a device body and a display panel as described in the above embodiment, and the display panel is combined with the device body as a whole.

In the embodiments of the present application, the device body may include a middle frame, a frame glue, etc., and the display device may be a display terminal such as a cell phone, a tablet, a TV, etc., without limitation herein.

In the above embodiments, the description of each embodiment has its own focus, and a part that is not described in detail in a certain embodiment can be seen in the relevant description of other embodiments.

The display panel and the display device provided by the embodiments of the present application have been described in detail above. The principles and embodiments of the present application are described in this paper by using specific examples. The descriptions of the above embodiments are only used to help understand the present application, technical solutions, and their core ideas. It should be understood by those of ordinary skill in the art that it is still possible to modify the technical solutions recorded in the preceding embodiments, or to replace some of the technical features with equivalent is ones. However, these modifications or replacements do not make an essence of the corresponding technical solutions deviate from a scope of the technical solutions of the embodiments of the present application.

What is claimed is:

1. A display panel, comprising:
   a substrate;
   a first metal layer disposed on the substrate, wherein the first metal layer comprises at least one first signal transmission portion;
   an insulating layer covering the substrate and the first metal layer, wherein the insulating layer comprises a protruding portion covering the first signal transmission portion, and wherein the protruding portion comprises a top surface far away from the first signal transmission portion and a sidewall connected to a peripheral side of the top surface; and
   a second metal layer disposed on a side of the insulating layer away from the first metal layer, wherein the second metal layer comprises at least one second signal transmission portion, and wherein the second signal transmission portion covers at least part of the sidewall of protruding portion;
   wherein the protruding portion comprises a first sub-layer and a second sub-layer which are arranged in layers, wherein the first sub-layer is positioned on a side of the second sub-layer away from the first signal transmission portion, wherein the protruding portion comprises at least one first hole provided at the sidewall, wherein the second signal transmission portion extends into the first hole and contacts the second sub-layer, and wherein an adhesion force between the second sub-layer and the second signal transmission portion is greater than an adhesion force between the first sub-layer and the second signal transmission portion.

2. The display panel according to claim 1, wherein the display panel comprises a plurality of thin film transistors disposed on the substrate, wherein the thin film transistor comprises a gate electrode, an active portion, a source electrode, and a drain electrode, and wherein the source electrode and the drain electrode are lapped with the active portion;
   wherein the first signal transmission portion comprises the gate electrode, wherein the second signal transmission portion comprises the source electrode and the drain electrode, wherein the protruding portion covers the gate electrode, wherein the active portion is disposed at the top surface of the protruding portion, wherein the source electrode covers the sidewall of the protruding portion and extends to a side of the active portion away from the protruding portion, wherein the source electrode in contact with the second sub-layer through the first hole, wherein the drain electrode covers the sidewall of the protruding portion and extends to the side of the active portion away from the protruding portion, and wherein the drain electrode is in contact with the second sub-layer through the first hole.

3. The display panel according to claim 1, wherein the display panel further comprises a non-display region, wherein the first signal transmission portion comprises a first wire arranged in the non-display region, wherein the second signal transmission portion comprises a second wire arranged in the non-display region, wherein the protruding portion covers the first wire, wherein the second wire is positioned at a side of the protruding portion away from the first wire, and wherein the second wire in contact with the second sub-layer by passing through the first hole.

4. The display panel according to claim 1, wherein the active portion is made of an oxide semiconductor material, and wherein the second sub-layer is made of a material that isolating water and oxygen.

5. The display panel according to claim 4, wherein a material of the first sub-layer comprises a silicon oxide material, and wherein a material of the second sub-layer comprises a silicon nitride material.

6. The display panel according to claim 1, wherein the protruding portion further comprises at least one second hole arranged on the top surface close to the sidewall, and wherein the second signal transmission portion also extends into the second hole and in contact with the second sub-layer.

7. The display panel according to claim 1, wherein the insulating layer further comprises a spacing portion, wherein the spacing portion is arranged between two adjacent protruding portions, and wherein the spacing portion comprises a third sub-layer and a fourth sub-layer which are arranged in layers, wherein the third sub-layer is positioned on a side of the fourth sub-layer away from the substrate, wherein the third sub-layer is in a same layer as the first sub-layer, and wherein the fourth sub-layer is in a same layer as the second sub-layer;
   wherein at least one third hole is provided on a side of the spacing portion close to the protruding portion, wherein the second signal transmission portion extends into the third hole and in contact with the fourth sub-layer, and wherein an adhesion force between the fourth sub-layer and the second signal transmission portion is greater than an adhesion force between the third sub-layer and the second signal transmission portion.

8. The display panel according to claim 7, wherein the display panel further comprises a first interlayer dielectric layer covering the insulating layer and the second metal layer, wherein the first interlayer dielectric layer and the third sub-layer are arranged in layers, and wherein a material of the first interlayer dielectric layer and a material of the third sub-layer comprise a silicon oxide material.

9. The display panel according to claim 8, wherein in a vertical direction corresponding to the spacing portion, a sum of a thicknesses of the third sub-layer and a thickness of the first interlayer dielectric layer is greater than or equal to 3300 angstroms and less than or equal to 4200 angstroms.

10. The display panel according to claim 9, wherein in the vertical direction corresponding to the spacing portion, the thickness of the third sub-layer is greater than or equal to 500 angstroms and less than or equal to 2000 angstroms, and wherein the thickness of the first interlayer dielectric layer is greater than or equal to 1000 angstroms and less than or equal to 3000 angstroms.

11. A display device, comprising a display panel, wherein the display panel comprises:
   a substrate;
   a first metal layer disposed on the substrate, wherein the first metal layer comprises at least one first signal transmission portion;
   an insulating layer covering the substrate and the first metal layer, wherein the insulating layer comprises a protruding portion covering the first signal transmission portion, and wherein the protruding portion comprises a top surface far away from the first signal transmission portion and a sidewall connected to a peripheral side of the top surface; and a second metal layer disposed on a side of the insulating layer away from the first metal layer, wherein the second metal layer comprises at least one second signal transmission portion, and wherein the second signal transmission portion covers at least part of the sidewall of protruding portion;

wherein the protruding portion comprises a first sub-layer and a second sub-layer arranged in layers, wherein the first sub-layer is positioned on a side of the second sub-layer away from the first signal transmission portion, wherein the protruding portion comprises at least one first hole provided at the sidewall, wherein the second signal transmission portion extends into the first hole and contacts the second sub-layer, and wherein an adhesion force between the second sub-layer and the second signal transmission portion is greater than an adhesion force between the first sub-layer and the second signal transmission portion.

12. The display device according to claim 11, wherein the display panel comprises a plurality of thin film transistors disposed on the substrate, wherein the thin film transistor comprises a gate electrode, an active portion, a source electrode, and a drain electrode, and wherein the source electrode and the drain electrode are lapped with the active portion;

wherein the first signal transmission portion comprises the gate electrode, wherein the second signal transmission portion comprises the source electrode and the drain electrode, wherein the protruding portion covers the gate electrode, wherein the active portion is disposed at the top surface of the protruding portion, wherein the source electrode covers the sidewall of the protruding portion and extends to a side of the active portion away from the protruding portion, wherein the source electrode in contact with the second sub-layer through the first hole, wherein the drain electrode covers the sidewall of the protruding portion and extends to the side of the active portion away from the protruding portion, and wherein the drain electrode is in contact with the second sub-layer through the first hole.

13. The display device according to claim 11, wherein the display panel further comprises a non-display region, wherein the first signal transmission portion comprises a first wire arranged in the non-display region, wherein the second signal transmission portion comprises a second wire arranged in the non-display region, wherein the protruding portion covers the first wire, wherein the second wire is positioned at a side of the protruding portion away from the first wire, and wherein the second wire in contact with the second sub-layer by passing through the first hole.

14. The display device according to claim 11, wherein the active portion is made of an oxide semiconductor material, and wherein the second sub-layer is made of a material that isolating water and oxygen.

15. The display device according to claim 14, wherein a material of the first sub-layer comprises a silicon oxide material, and wherein a material of the second sub-layer comprises a silicon nitride material.

16. The display device according to claim 11, wherein the protruding portion further comprises at least one second hole arranged on the top surface close to the sidewall, and wherein the second signal transmission portion also extends into the second hole and in contact with the second sub-layer.

17. The display device according to claim 11, wherein the insulating layer further comprises a spacing portion, wherein the spacing portion is arranged between two adjacent protruding portions, and wherein the spacing portion comprises a third sub-layer and a fourth sub-layer which are arranged in layers, wherein the third sub-layer is positioned on a side of the fourth sub-layer away from the substrate, wherein the third sub-layer is in a same layer as the first sub-layer, and wherein the fourth sub-layer is in a same layer as the second sub-layer;

wherein at least one third hole is provided on a side of the spacing portion close to the protruding portion, wherein the second signal transmission portion extends into the third hole and in contact with the fourth sub-layer, and wherein an adhesion force between the fourth sub-layer and the second signal transmission portion is greater than an adhesion force between the third sub-layer and the second signal transmission portion.

18. The display device according to claim 17, wherein the display panel further comprises a first interlayer dielectric layer covering the insulating layer and the second metal layer, wherein the first interlayer dielectric layer and the third sub-layer are arranged in layers, and wherein a material of the first interlayer dielectric layer and a material of the third sub-layer comprise a silicon oxide material.

19. The display device according to claim 18, wherein in a vertical direction corresponding to the spacing portion, a sum of a thicknesses of the third sub-layer and a thickness of the first interlayer dielectric layer is greater than or equal to 3300 angstroms and less than or equal to 4200 angstroms.

20. The display device according to claim 19, wherein in the vertical direction corresponding to the spacing portion, the thickness of the third sub-layer is greater than or equal to 500 angstroms and less than or equal to 2000 angstroms, and wherein the thickness of the first interlayer dielectric layer is greater than or equal to 1000 angstroms and less than or equal to 3000 angstroms.

* * * * *